United States Patent
Rosendahl et al.

(10) Patent No.: US 8,750,364 B2
(45) Date of Patent: Jun. 10, 2014

(54) INTERPOLATION OF FILTER COEFFICIENTS

(71) Applicant: ST-Ericsson SA, Plan-les-Ouates (CH)

(72) Inventors: Jens Rosendahl, Turku (FI); Ville Ruuska, Piispanristi (FI); Mika Salmi, Turku (FI)

(73) Assignee: ST-Ericsson SA, Plan-les-Ouates (CH)

( * ) Notice: Subject to any disclaimer, the term of this patent is extended or adjusted under 35 U.S.C. 154(b) by 0 days.

(21) Appl. No.: 13/724,274

(22) Filed: Dec. 21, 2012

(65) Prior Publication Data

US 2013/0170582 A1   Jul. 4, 2013

Related U.S. Application Data

(60) Provisional application No. 61/582,299, filed on Dec. 31, 2011.

(51) Int. Cl.
*H03H 7/30* (2006.01)
*H04K 1/02* (2006.01)

(52) U.S. Cl.
USPC .......................................... 375/232; 375/297

(58) Field of Classification Search
CPC ................. H03H 17/0266; H04L 2025/03414; H04L 27/12
USPC ............................................... 375/232, 297
See application file for complete search history.

(56) References Cited

U.S. PATENT DOCUMENTS

| | | | |
|---|---|---|---|
| 5,157,623 A | 10/1992 | Hayashi | |
| 5,479,362 A | 12/1995 | Sun et al. | |
| 5,856,934 A | 1/1999 | Nakajima et al. | |
| 6,212,229 B1 | 4/2001 | Salinger | |
| 7,397,850 B2 | 7/2008 | Easley et al. | |
| 7,477,686 B2 | 1/2009 | Yellin et al. | |
| 7,912,145 B2 | 3/2011 | Yellin et al. | |
| 2003/0195910 A1 | 10/2003 | Corless et al. | |
| 2004/0183602 A1 | 9/2004 | Maunuksela et al. | |
| 2012/0314771 A1* | 12/2012 | Lim et al. | 375/240.16 |

FOREIGN PATENT DOCUMENTS

EP   0135066 A2   3/1985

OTHER PUBLICATIONS

Lee et al., A Quad-Band GSM-GPRS Transmitter with Digital Auto-Calibration, Journal of Solid-State Circuits, Dec. 2004, pp. 2200-2214, vol. 39, No. 12, IEEE.

* cited by examiner

*Primary Examiner* — Don N Vo
(74) *Attorney, Agent, or Firm* — Piedmont Intellectual Property (57) ABSTRACT

The frequency response of a digital filter, such as a pre-emphasis filter in a signal transmitter having a phase-locked loop, is adjusted using interpolation of the filter coefficients, enabling sets of filter coefficients to be pre-computed or generated as needed in the transmitter. The phase error behavior of the digital filter can be significantly improved.

11 Claims, 11 Drawing Sheets

INTERPOLATION OF FILTER COEFFICIENTS

This application claims the benefit of the filing date of U.S. Provisional Patent Application No. 61/582,299 filed on Dec. 31, 2011, which is incorporated here by reference.

BACKGROUND

This invention relates to electronic systems, and more particularly to digital filters, and even more particularly to filters used in communication systems.

In wireless communication systems such as those according to the GSM and other specifications organized by the Third Generation Partnership Project (3GPP), gaussian minimum shift keying (GMSK) modulation is used for impressing a data signal to be transmitted onto a radio frequency (RF) carrier signal. The modulated carrier signal is then transmitted by a communication device, such as a mobile telephone, computer, etc.

GMSK modulation can be applied directly to a frequency synthesizer that generates the RF carrier signal in the transmitter of the communication device. Direct synthesizer modulation can give better RF signal-to-noise performance than a traditional quadrature (in-phase/quadrature-phase, or I/O) modulator. Nevertheless, the frequency synthesizer is often a phase-locked loop (PLL), and PLLs usually have a modulation bandwidth (BW) that is too low for the GMSK modulation specified for the transmitter (TX). Even so, a pre-emphasis filter can effectively increase a PLL's modulation BW.

Figure 1:
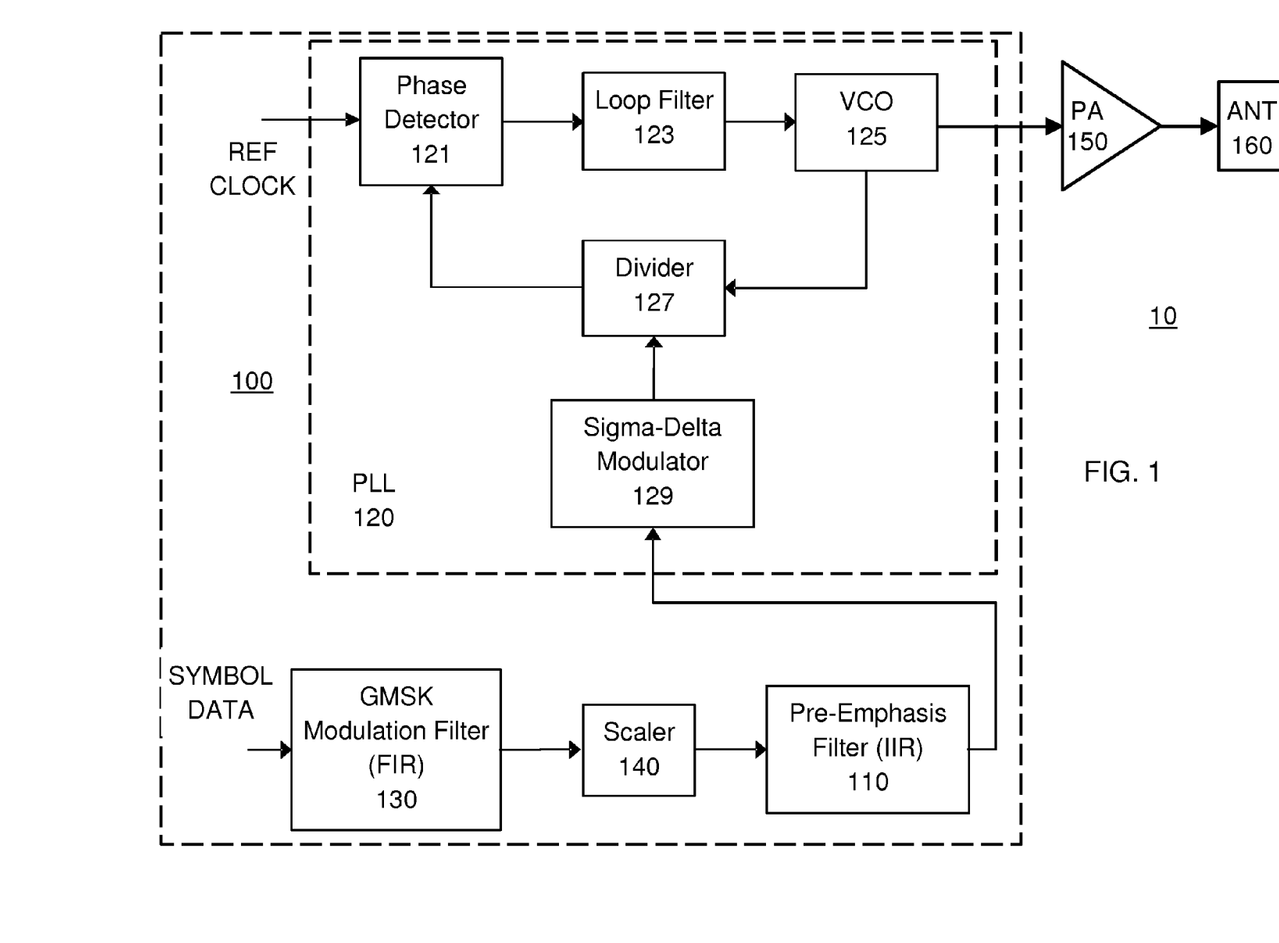
FIG. 1 is a block diagram of an electronic signal modulator.

A typical single-point polar modulator for GMSK is built up as depicted in FIG. 1, which is a block diagram of a single-point GMSK polar modulator 100 that can be used in a communication device 10, such as a mobile telephone or other communication device. A pre-emphasis filter 110 is used to compensate for the frequency response characteristics of a phase-locked loop (PLL) 120, which includes a phase detector 121 that receives a reference clock signal of the carrier frequency, a loop filter 123, a voltage controlled oscillator (VCO) 125 that produces the modulated carrier signal, a divider 127, and a sigma-delta modulator 129. Symbol data to be impressed on the carrier signal is provided to a filter 130 having a frequency response suitable for GMSK modulation, such as a digital finite-impulse response (FIR) filter, and the spectrally shaped symbol data is provided to a suitable scaler 140. The pre-emphasis filter 110 can also be a digital filter.

Figure 2:
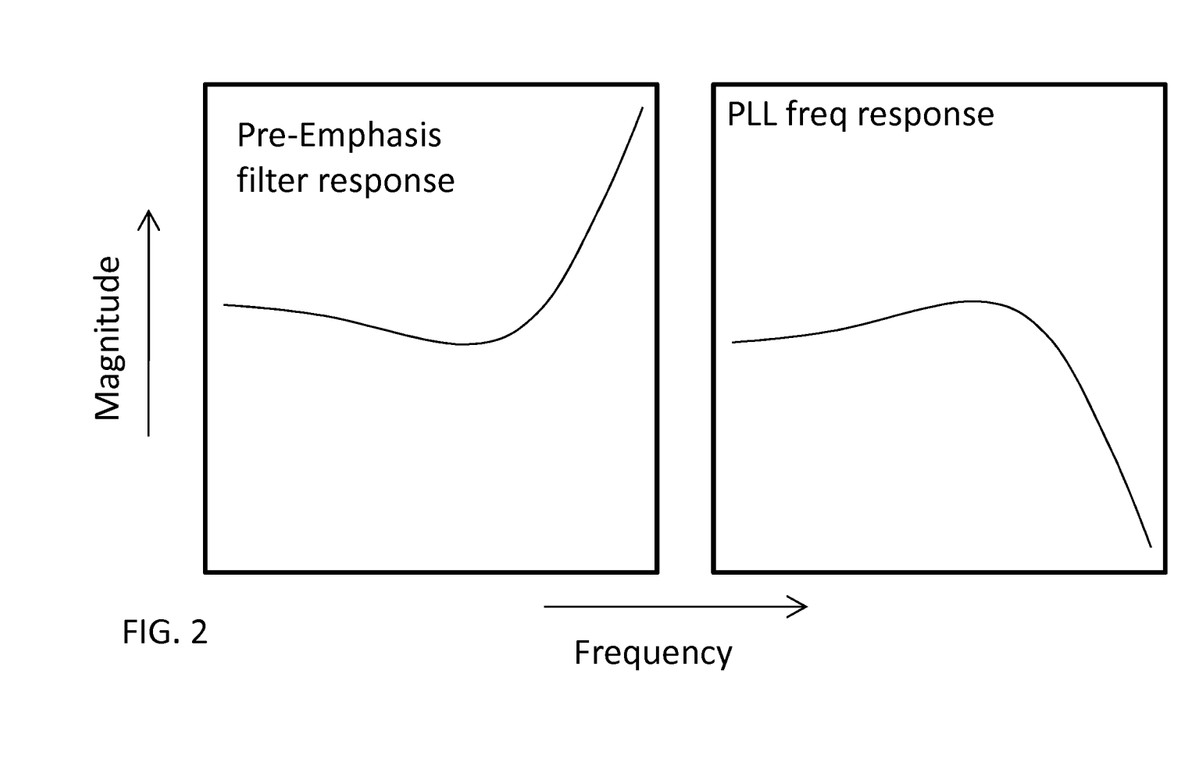
FIG. 2 illustrates frequency responses of a pre-emphasis filter and a phase-locked loop of the modulator.

FIG. 2 illustrates a frequency response (i.e., output signal magnitude with respect to frequency) of a pre-emphasis filter 110 and a frequency response of a PLL 120. As illustrated, the frequency response of the pre-emphasis filter is intended to compensate the frequency response of the PLL, which is to say that the combined frequency response is more or less flat (i.e., more or less constant magnitude with respect to frequency). In previous solutions, the filter coefficients of the digital pre-emphasis filter have been pre-calculated and stored in a memory, from which they have been fetched when needed.

For example, U.S. Patent Application Publication No. US 2004/0183602 describes measuring an actual value of at least one filter component in a PLL and a controller for determining at least one adaptive filter coefficient using the measured value to compensate for deviation of the measured value from an ideal value. The adaptive filter coefficients are obtained from look-up tables in order to reduce computational load, and generic methods of generating filter coefficients for a look-up table (or for direct use) are disclosed.

S. T. Lee et al., "A Quad-Band GSM-GPRS Transmitter with Digital Auto-Calibration", IEEE J. Solid-State Circuits, vol. 39, no. 12, pp. 2200-2214, December 2004, describes a modulator with auto-calibration, in which data to be transmitted is sent through a modulation filter in parallel with a pre-distortion filter. The filter outputs are summed together and sent to a delta-sigma modulator, with the pre-distortion filter branch multiplied by a DC signal selected from a look-up table in an "auto-calibration process".

Figure 3A:
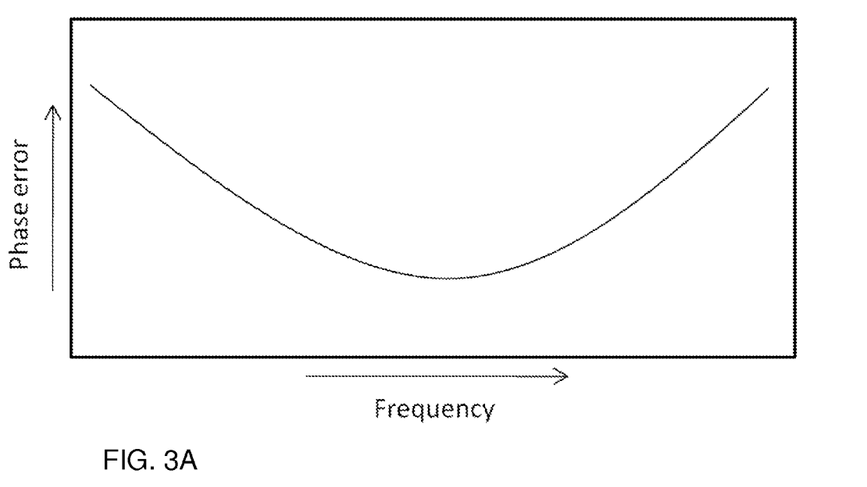
FIGS. 3A, 3B, 3C, 3D are representative plots of phase error with respect to frequency that illustrate manufacturing process and temperature variations and other error effects.

In real applications, however, matching the frequency responses of the pre-emphasis filter and the PLL is always less than perfect. Mismatches and other variations often cause higher-order modulation phase errors toward the edges of the usable operation area, and FIG. 3A is a plot of an example of such behavior of phase error with respect to frequency. Such phase error behavior increases the risk of exceeding regulatory or other specification limits on the performance of a modulator.

Figure 3B:
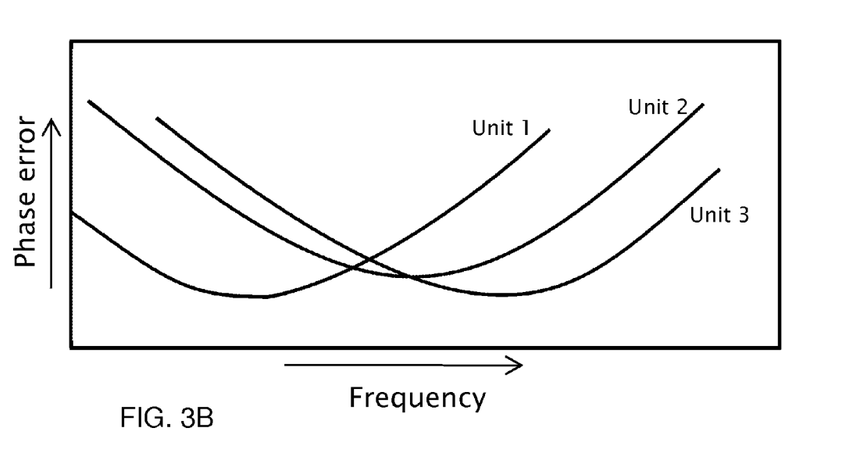
Figure 3C:
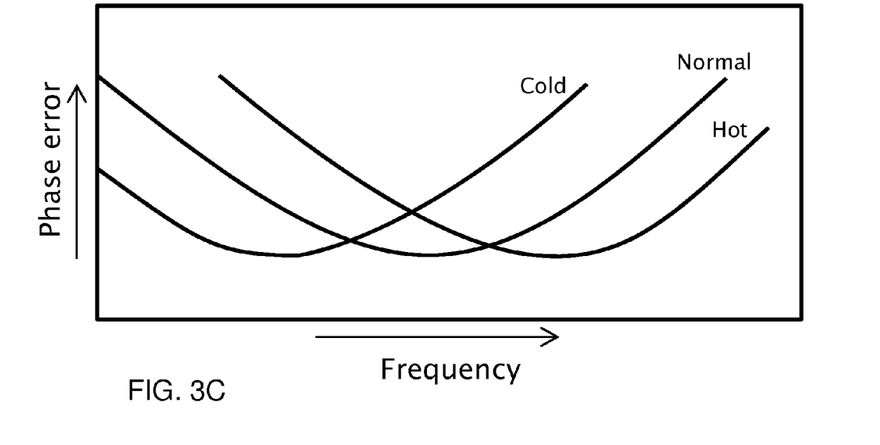

Mismatch can arise from variations in the manufacturing process, temperature sensitivities, etc. of the modulator components. FIG. 3B depicts representative phase error behaviors of three different modulators, Units 1, 2, 3, that illustrate the effect of manufacturing process variations. As for temperature sensitivity, FIG. 3C depicts representative phase error behaviors of a modulator at three different temperatures, Cold, Normal, Hot, that illustrate the effect of temperature variations.

Figure 3D:
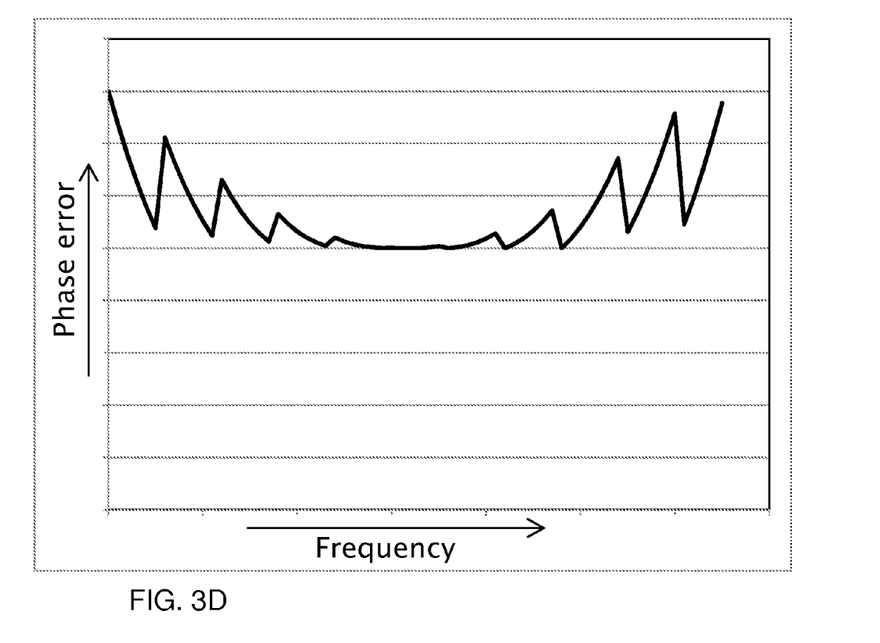

Mismatch can also arise because the PLL's VCO usually uses different divider ratios (i.e., changed numerical content of integer and/or fractional dividers) in order to enable the modulator to operate through a wide frequency band. The different divider ratios correspond to different frequency ranges, which may be called sub-bands, in the wide frequency band. FIG. 3D illustrates a representative saw-tooth-shaped behavior of the phase error over a wide frequency band that is observed with a PLL having a VCO that covers the wide band with a number of contiguous narrower sub-bands. The "tooth length", which is to say, the distance in frequency between peaks of the phase error, typically corresponds to the length of a VCO sub-band and is caused by imperfect tunings of components that cause the loop response to change faster inside the sub-band than between sub-bands.

Figure 4:
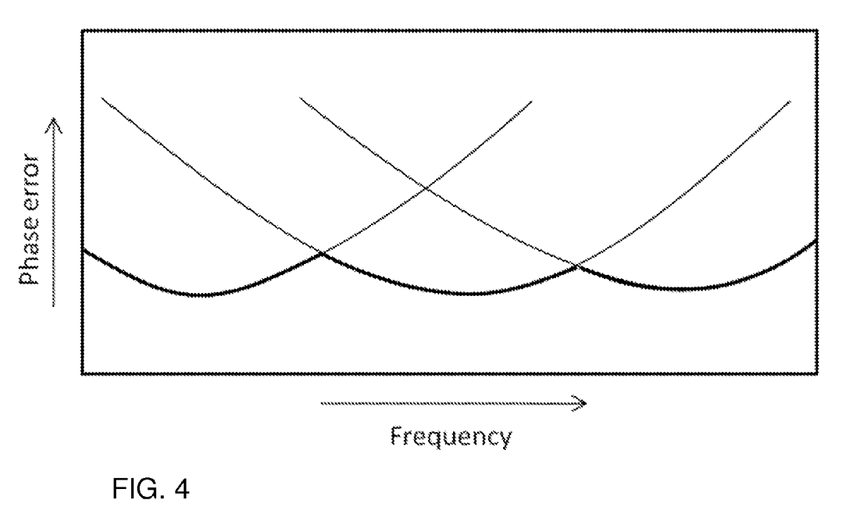
FIG. 4 depicts phase error with respect to frequency for three different sets of pre-emphasis filter coefficients.

Multiple sets of pre-computed coefficients for the pre-emphasis filter 110 can be used to approximate an adjustable response of the filter. This is illustrated by FIG. 4, which depicts phase error with respect to frequency for three different sets of filter coefficients that yield respective minimal phase errors at respective different frequencies. The set of coefficients used for a given frequency would be the set that yielded a phase error less than the phase error of any other set at that frequency.

For example, U.S. Pat. No. 7,477,686 generally describes generating and selecting filters with filter parameters, e.g., for a phase modulator, using stored look-up tables for calculating the filter parameters or interpolating between two or more known sets of filter parameters. Interpolation is discussed only on a general level, and the patent focuses on measuring direct parameters of a PLL (such as gain, frequency response, etc.) and generating the filter based on that.

U.S. Pat. No. 7,912,145 describes an adaptive filter for a fractional-N sigma-delta modulator based on measuring frequency after the modulation frequency and comparing it to the signal after the loop filter. A suitable set of filter coefficients is calculated to adjust for variations in the analog parts of the PLL, although the patent does not explain how the calculations performed once it has determined what kind of response is needed from the pre-emphasis filter.

Nevertheless, such prior solutions require a vast amount of numerical data that has to be first pre-computed and then inspected manually for possibly needed numerical adjustments in coefficients and/or signal scaling. Thus, such solutions tend to be memory consuming and also error prone during the design phase of a modulator.

SUMMARY

The above-described and other problems with prior solutions can be overcome by adjusting the frequency response of the pre-emphasis filter using interpolation. Thus, phase error behavior can be kept substantially optimal with respect to transmit frequency. Pre-computed sets of filter coefficients can be generated quickly or a run-time algorithm can be provided to compute filter coefficients on the fly in the modulator.

In accordance with aspects of this invention, there is provided a method in a digital processor circuit of generating a set of interpolated coefficients of a digital filter configured with at least one net, where a net includes a group of filter coefficients of a respective feedback or feed-forward loop in the digital filter. The method includes finding, by the digital processor circuit for a net, a smallest slope in sets of estimation coefficients for filter coefficients of the net, where a respective set of estimation coefficients for each filter coefficient includes a base coefficient value and a slope; generating a respective interpolated filter coefficient of the smallest slope based on a frequency difference value according to an interpolation function and the slope; computing an adjusted frequency difference value based on the frequency difference value; and generating remaining interpolated filter coefficients of the net based on the respective estimation coefficients and the adjusted frequency difference value according to the interpolation function.

Also in accordance with aspects of this invention, there is provided a digital filter configured with at least one net, each net including a group of filter coefficients of a respective feedback or feed-forward loop in the digital filter that includes a digital processor circuit configured to generate a set of interpolated coefficients of the digital filter. The digital processor circuit generates the set of interpolated coefficients by at least finding, for a net, a smallest slope in sets of estimation coefficients for filter coefficients of the net, where a respective set of estimation coefficients for each filter coefficient includes a base coefficient value and a slope; generating a respective interpolated filter coefficient of the smallest slope based on a frequency difference value according to an interpolation function and the slope; computing an adjusted frequency difference value based on the frequency difference value; and generating remaining interpolated filter coefficients of the net based on the respective estimation coefficients and the adjusted frequency difference value according to the interpolation function.

Also in accordance with aspects of this invention, there is provided an electronic signal modulator that includes a pulse-shaping filter configured for receiving a digital modulation data signal; a phase-locked loop (PLL) configured for generating a carrier signal modulated by the digital modulation data signal, where the PLL has a low-pass frequency response; and a digital pre-emphasis filter having a frequency response configured for compensating the frequency response of the PLL, where the frequency response of the pre-emphasis filter is determined by a set of interpolated filter coefficients and the digital pre-emphasis filter is configured with at least one net, each net including a group of filter coefficients of a respective feedback or feed-forward loop.

The set of interpolated filter coefficients are generated by at least finding, by the digital processor circuit for a net, a smallest slope in sets of estimation coefficients for filter coefficients of the net, where a respective set of estimation coefficients for each filter coefficient includes a base coefficient value and a slope; generating a respective interpolated filter coefficient of the smallest slope based on a frequency difference value according to an interpolation function and the slope; computing an adjusted frequency difference value based on the frequency difference value; and generating remaining interpolated filter coefficients of the net based on the respective estimation coefficients and the adjusted frequency difference value according to the interpolation function.

BRIEF DESCRIPTION OF THE DRAWINGS

The various features, objects, and advantages of this invention will be understood by reading this description in conjunction with the drawings, in which.

DETAILED DESCRIPTION

As described below, the frequency response of a digital pre-emphasis filter is advantageously adjusted using interpolation and/or extrapolation of the filter coefficients, enabling sets of filter coefficients to be pre-computed or generated as needed in a modulator, which can be arranged as depicted in FIG. 1. Such a modulator can be included in a wireless communication device 10 that is depicted in FIG. 1, and can provide a modulated RF signal to a suitable power amplifier 150, with the amplified modulated RF signal provided to a suitable antenna 160. In general, "interpolation" in this application should be understood as referring to interpolation and/or extrapolation except for those few instances in which "extrapolation" is explicitly used.

It may be noted that the techniques described in this application differ from prior techniques in various ways. For example, the kind of run-time connection described in the above-cited U.S. Pat. No. 7,477,686 is not necessary when a PLL frequency response is calibrated and modeled in order to estimate how the PLL response varies with temperature and with the actual divider ratio in the PLL. The techniques described below can be optimized for an IIR digital pre-distortion filter that has the lowest possible bit-resolution (in order to save silicon area, which generally increases exponentially with the bit resolution of an IIR filter implemented in integrated circuitry rather than in software). In addition, methods of intelligently interpolating are provided that speed up computations (e.g., by avoiding floating-point or 64-bit fixed-point arithmetic), which can be important for cheaper/ smaller electronic processors. Simple interpolation is not a solution that works well in a real filter implementation because usually only a subset of the interpolated coefficients can meet the requirements set for the filter due to quantization problems in the interpolation experienced by filters implemented with fixed-point arithmetic. Furthermore, the techniques described below can handle the change in filter gain that results from interpolation simply by calculating the DC gain of the filter and adjusting it with a digital signal scaler, which is often already present in a transmitter to set the correct frequency modulation (FM) deviation for the modulator.

Overview

The inventors have recognized that by setting suitable constraints for a digital pre-emphasis filter of the IIR type, there exists a useful linear relationship between any two given sets of filter coefficients. Thus, desirable properties of the filter can be retained by properly selecting and handling the numerical values, e.g., handling rounding errors. Several alternative methods and apparatus embodying the invention are described below.

It should be understood, however, that the invention is not limited to IIR-type pre-emphasis filters but also includes finite-impulse-response (FIR) pre-emphasis filters. In general, all FIR filters in relevant scenarios are a subset of all IIR filters, considering that a FIR filter can be substantially equivalent to an IIR filter with feedback zero. Of course, an FIR filter having the same characteristics as an IIR filter can require many more taps (e.g., about ten times as many), and so updating a filter with so many taps at run time can present issues for less capable electronic processors. Even so, it is currently believed that updating as few as 100 register values for a filter only when the VCO frequency or other transmitter parameters change can yield sufficient performance.

Figure 5A:
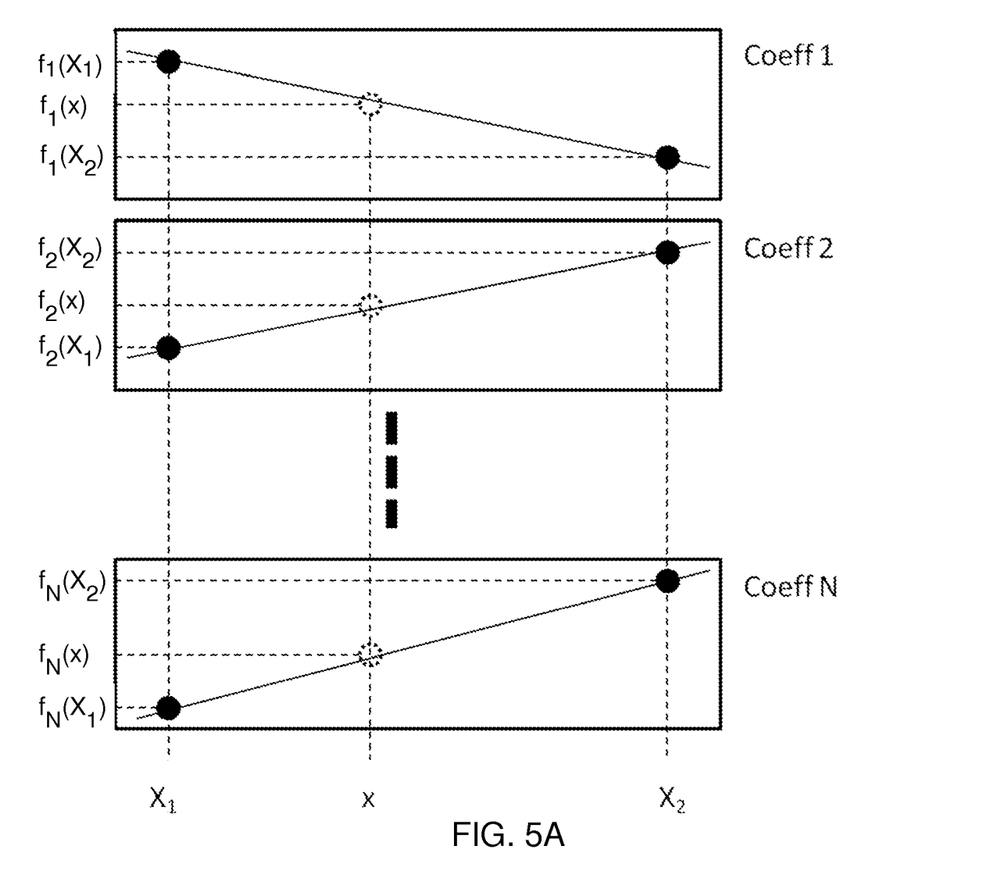
FIGS. 5A, 5B illustrate methods of generating interpolated filter coefficients in accordance with aspects of this invention.

FIG. 5A illustrates a first alternative method of generating filter coefficients based on interpolation and/or extrapolation using two or more sets of pre-computed filter coefficients. For example, FIG. 5A shows two sets of filter coefficients Coeff 1, Coeff 2, . . . , Coeff N, with the coefficient Coeff 1 in the first set denoted $f_1(X_1)$ at a value $X_1$, and in the second set denoted $f_1(X_2)$ at a value $X_2$, etc. As shown, linear interpolation can be used to generate an interpolated filter Coeff 1 denoted $f_1(x)$ at an interpolated value x, and so forth with respect to generating interpolated values for the other filter coefficients Coeff 2, . . . , Coeff N.

Figure 5B:
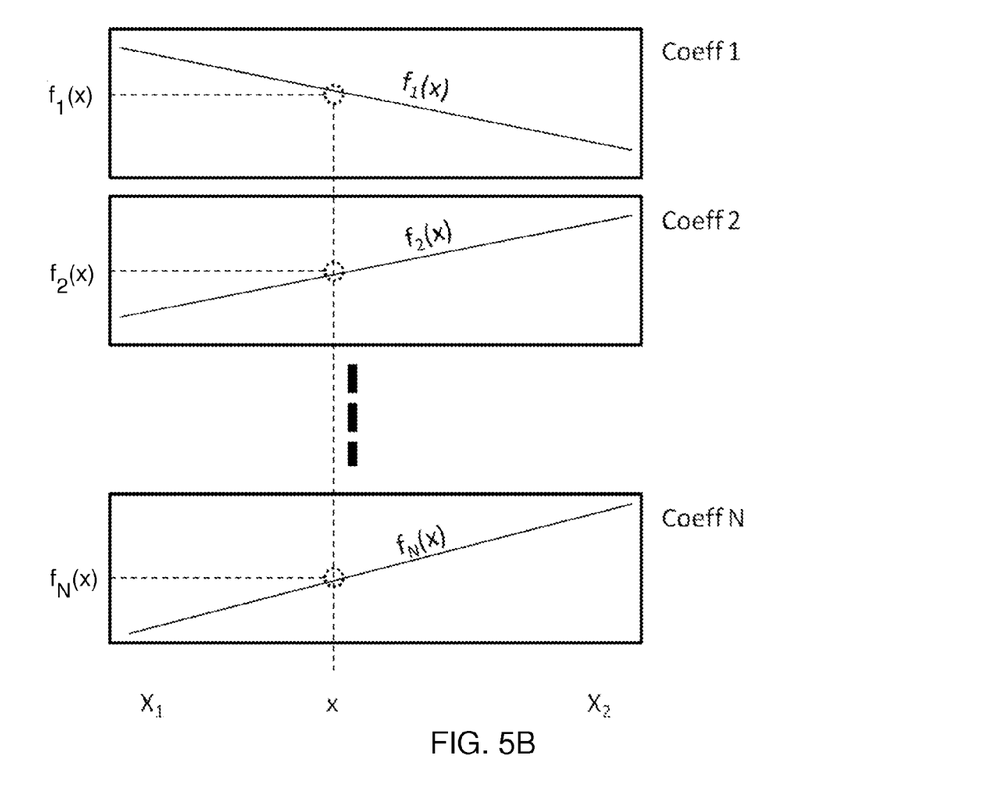

FIG. 5B illustrates a second alternative method of generating filter coefficients based on one or more function sets (i.e., vectors of functions). A set of functions, generally including one function for each filter coefficient, is used to calculate the desired suitable set of coefficients. For example, FIG. 5B depicts a function $f_1(x)$ for a filter coefficient Coeff 1, a function $f_2(x)$ for a filter coefficient Coeff 2, . . . , a function $f_N(x)$ for a filter coefficient Coeff N, with the respective functions used to generate an interpolated filter Coeff 1 denoted $f_1(x)$ at a value x, etc. In a typical example, the functions f(x) can have a linear form f(x)=C+mx, but the functions can in general have any order or form needed to provide the desired behavior of the pre-emphasis filter 110. Of course, there is always a trade-off between computational complexity and exactness of the model behavior, setting aside the non-linearities, exponentialities, etc. of a real-world implementation. That trade-off influences the choice of interpolation functions, e.g., linear (first order), higher order, polynomial, etc.

In addition, the run-time calculations needed may have to be handled by electronic processors that are short on resources, especially because the timing requirements may be stringent, e.g., only a few microseconds may be available for calculating a new filter and setting it up.

In a third alternative method of generating filter coefficients, the coefficients can be partly or fully indirectly generated by utilizing other constraints or known properties of the pre-emphasis filter. For example, a first coefficient in a net (feed-forward or feedback) can be generated by interpolation/ extrapolation as described above in connection with FIG. 5A, and then for example a known DC gain can be applied to produce another coefficient (which can be suitable for a net with two coefficients). For another example, ratios or sums between coefficients can be interpolated and the results used with the DC gain to produce all of the coefficients for a net (which can be suitable for a net with more than two coefficients). It will be understood that a "net" means a group of coefficients forming either a feedback or feed-forward loop, as described in more detail below in connection with FIG. 6.

In yet another alternative method, coefficients can be computed by any combination of the above-described three alternatives.

Example of Usage in a Real Implementation

The following illustrative example is a description of the usage of an interpolation algorithm implemented in software. This development flow and algorithm is directed to a pre-emphasis filter 110 that is a digital infinite impulse response (IIR) filter, which can be implemented by a suitably programmed or configured electronic signal processor or circuitry 600 depicted in FIG. 6.

Figure 6:
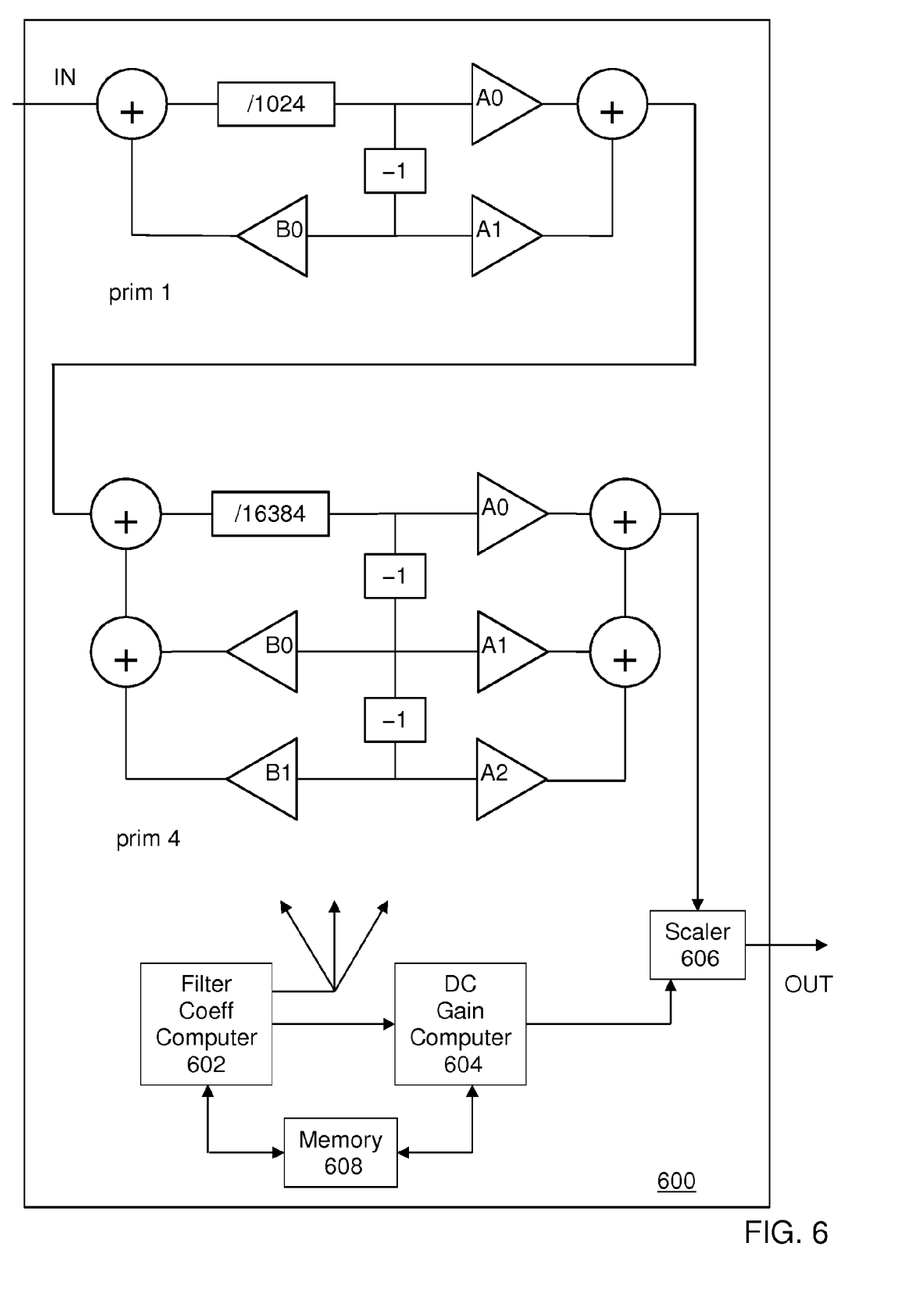
FIG. 6 is a block diagram of a signal processor configured for a digital filter having an infinite impulse response.

As depicted in FIG. 6, the processor 600 is configured to implement an IIR filter having a two-section direct canonical form, but it will be understood that the IIR filter can be implemented in other equivalent forms, including cascade, parallel, etc. The first section prim 1 is a first-order section, and the filter coefficients A0, A1, B0 are the coefficients of respective multipliers arranged as shown between two adders. The first section includes a single delay (−1), and a divider that reduces the bit-depth, or resolution, by a factor of 1024, effectively truncating ten least-significant bits (LSBs). The second section prim 4 is a second-order section, having filter coefficients A0, A1, A2, B0, B1 that are the coefficients of respective multipliers arranged as shown between four adders, with two delays and a divider that effectively reduces the bit-depth by a factor of 16384, effectively truncating fourteen LSBs.

Examples of nets are the loop that includes A0 and A1 in prim 1 and the loop that includes B0 and B1 in prim 4. As depicted in FIG. 6, prim 1 comprises two nets of which one is feed-forward (i.e., the loop that includes A0 and A1) and one is feedback (i.e., the loop that includes B0), and prim 4 comprises four nets of which two are feedforward (i.e., the loop that includes A0 and A1, and the loop that includes A1 and A2) and two are feedback (i.e., the loop that includes B0, and the loop that includes B0 and B1). It will be noted that this application uses the letter A to denote coefficients in the non-recursive (feed-forward) part of an IIR filter and the letter B to denote coefficients in the recursive (feedback) part of an IIR filter, but that is not necessary.

Truncation is advantageously done as the signal at this stage is unnecessarily exact. In general, multiplying two binary numbers produces a result that has as many bits as the two numbers together, e.g., multiplying two ten-bit numbers produces a twenty-bit result. So in fixed-point representation, multiplying two ten-bit numbers containing information coded as three integer bits and seven fractional bits (i.e., q3.7)

produces a result that is six integer bits and fourteen fractional bits (i.e., q6.14). For such digitally represented signals, it can be seen that the first several of those fourteen LSBs contain nothing reliable and can be thrown away. In many iterative algorithms, it is common for a result to be truncated, or rounded, to the same bit resolution as the input to the result.

For clarity, the filter coefficients of the different sections are identified below by leading section indices, i.e., 1A0, 1A1, 1B0 are the coefficients of section prim 1 and 4A0, 4A1, 4A2, 4B0, 4B1 are the coefficients of section prim 4. The transfer function of the IIR filter depicted in FIG. 6 is given by:

$$1H(z)=(1A0+1A1z^{-1})/(1024-1B0z^{-1})$$

which is the transfer function of the prim 1 section, and by:

$$4H(z)=(4A0+4A1z^{-1}+4A2z^{-2})/(16384-4B0z^{-1}-4B1z^{-2})$$

which is the transfer function of the prim 4 section. The DC gains are determined by setting all z=1 (i.e., DC), and so the total DC gain of the IIR filter is given by:

$$DC\ Gain=(1A0+1A1)(4A0+4A1+4A2)/(1024-1B0)(16384-4B0-4B1)$$

As described in more detail below, the filter coefficients of the prim 1 and prim 4 sections are programmable and can be computed by the processor 600 using interpolation, and thus the filter can be configured at run-time, i.e., upon use by a transmitter 100, to adjust its frequency response to compensate the frequency response of the PLL. The processor 600 is thus configured with a filter coefficient computer 602 that provides filter coefficient values to the filter sections and to a DC gain computer 604, which computes a DC gain value from the filter coefficients and provides the DC gain value to a scaler 606. The processor 600 also includes or accesses suitable memory 608 for use by the computers 602, 604 in carrying out their operations.

The IIR filter form depicted in FIG. 6 is currently believed to exhibit a good trade-off between silicon area footprint and signal quality (which is to say, computational exactness). The multipliers are advantageously 12-bit to 16-bit multipliers, and while higher resolution multipliers can be desirable, such devices can require too much in terms of silicon area as the size of the multipliers (which are the dominant components in the arrangement of FIG. 6) is more or less proportional to 2 raised to the power of the number of bits.

As described above, it is also generally better from a computational complexity point of view for the filter as a whole to have a lower number of coefficients. Compared to the IIR-type filter depicted in FIG. 6, an equivalent FIR-type filter might have, for example, 96 taps, and such a large number of filter coefficients can strain the capability of the electronic processor or processors handling the interpolation computations. The artisan will understand, of course, that although an IIR-type filter needs fewer computations, an IIR filter can become unstable if not properly designed due, mainly, to its use of feedback that produces the infinite impulse response.

Figure 7A:
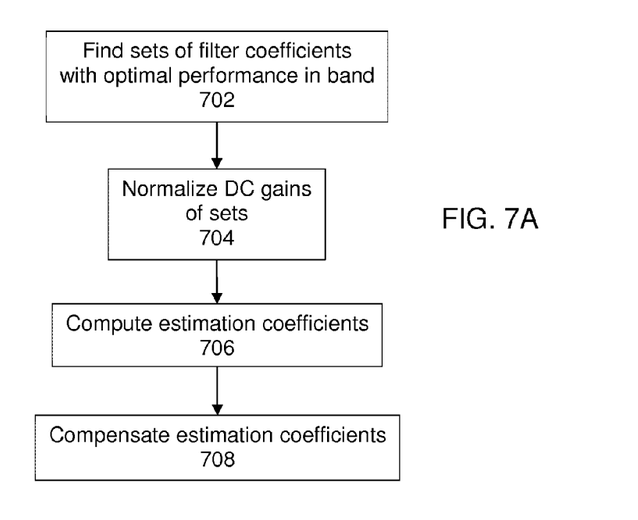
FIGS. 7A, 7B, and 7C are flow charts illustrating methods of configuring a digital filter in accordance with aspects of this invention.

To carry out its methods of interpolating filter coefficients of a digital pre-emphasis filter, the processor 600 relies on a development method that is illustrated by the flowchart in FIG. 7A.

The development method begins with finding (step 702) at least two initial sets of filter coefficients that have optimal performance at respective frequencies in the frequency band of interest. Two initial sets are advantageous, one with optimal performance at a lower end of a frequency band and the other with optimal performance at a higher end of the frequency band. The initial sets of filter coefficients can be determined in any convenient way, for example, by measurements on real hardware, i.e., a real transmitter 100, or by using any standard method (i.e., algorithm or calculation) suitable for that purpose. Computer simulation of real hardware can be used to define sets of filter coefficients with optimum responses at certain frequencies. For example, commercially available computer software, such as MATLAB developed by The MathWorks, Inc., with its filter design and analysis tool pack, can be used to find initial sets of filter coefficients.

The development method proceeds with normalizing (step 704) the initial sets of filter coefficients so that they have the same DC gain for all nets having more than one coefficient. Normalization reduces bad interpolation results in regions where the DC gain of a net changes, and it is currently believed that normalization is particularly helpful for feed-forward nets. A numerical example of the result of step 704 for two initial sets of coefficients of the filter of FIG. 6 is illustrated by the following Table 1.

In Table 1, the entries in the Param column identify the coefficients (multipliers) and gains of the A and B nets, or loops, in the prim 1 and prim 4 sections of the filter depicted in FIG. 6. The lower end of the frequency band is taken as 880 megahertz (MHz), the higher end of the band is taken as 914 MHz, and the Delta entries are the differences between the Lo and Hi entries, i.e., the filter coefficients at the Lo and Hi frequencies. For example, the set of filter coefficients at the Lo frequency can be viewed as the set denoted $f_1(X_1)$, $f_2(X_1), \ldots, f_N(X_1)$ depicted in FIG. 5A.

It should be understood that Table 1 is not necessarily the only possible table of filter coefficients. More than one table of normalized coefficients that are optimal at particular frequencies may be possible in some cases, but it is currently believed that it is not likely in most cases. The coefficient search space is huge, and so a brute force strategy of testing every possible set of coefficients is impracticable. One may be able to make small numerical changes in some directions without observing any difference in the behavior of a real application, but that does not mean that it would necessarily be so theoretically.

TABLE 1

| Param | Lo/880 MHz | Hi/914 MHz | Delta |
|---|---|---|---|
| 1A0 | 1796 | 1788 | −8 |
| 1A1 | −1774 | −1766 | 8 |
| 1B0 | −131 | −141 | −10 |
| 4A0 | 4500 | 4900 | 400 |
| 4A1 | −8691 | −9467 | −776 |
| 4A2 | 4208 | 4584 | 376 |
| 4B0 | 14160 | 14030 | −130 |
| 4B1 | 2041 | 2171 | 130 |
| Gain 1A | 22 | 22 | |
| Gain 4A | 17 | 17 | |
| 1/Gain 4B | 183 | 183 | |

From the normalized sets of filter coefficients (e.g., the Lo and Hi sets in Table 1), the development method proceeds with generating (step 706) sets of at least two estimation coefficients for each filter coefficient that enable interpolation and extrapolation based on the normalized filter coefficients. As Table 1 has two sets of normalized filter coefficients, one set for the Lo frequency and one set for the Hi frequency, it is straightforward to interpolate linearly between pairs of corresponding normalized filter coefficients and extrapolate linearly around them, thereby using the normalized filter coefficients in each pair as end points for the interpolation or extrapolation. In such a case, each set of estimation coefficients for each respective normalized filter coefficient can include a base coefficient value C and a slope m, where the base coefficient value C is typically a filter coefficient value that is optimal at a particular frequency, or base frequency, for the set.

Table 2 below shows such sets of values and slopes for the normalized filter coefficients in Table 1, and for a base frequency of 880 MHz. Table 2 can be stored in the memory 608 for use in generating interpolated or extrapolated filter coefficients at run-time.

TABLE 2

| Param | C (base) | m (slope) |
|-------|----------|-----------|
| 1A0   | 1796     | −0.024    |
| 1A1   | −1774    | 0.024     |
| 1B0   | −131     | −0.029    |
| 4A0   | 4500     | 1.176     |
| 4A1   | −8691    | −2.282    |
| 4A2   | 4208     | 1.106     |
| 4B0   | 14160    | −0.382    |
| 4B1   | 2041     | 0.382     |

Table 2 can be viewed as a convenient pre-computation of the slopes m and thus the sets of estimation coefficients, which can reduce the number of run-time computations for a linear interpolation/extrapolation according to:

$$f(x) = C + mx$$

in which x represents a frequency difference from the base frequency of the coefficient value C. A particularly convenient frequency unit to use in any interpolation/extrapolation is 100 kHz as that represents the minimum difference between transmit frequencies on any cellular radio communication system. Thus, for the coefficient 1A0 for example:

$$\text{Slope } m = (1788-1796)/(9140-8800) = 0.023529411.$$

It will be noted that for a real rather than simulated implementation, the slope values would probably have fixed-point notation in a suitable format. Numerical values in Table 2 are truncated/rounded for editorial clarity, but in a real application, more significant digits can be needed to make the interpolation/extrapolation work well.

Upon generation of Table 2 or its equivalent sets of estimation coefficients, the development method can be considered complete, but it can be advantageous to include compensating (step 708) the values in Table 2 and so the pre-emphasis filter for possible silicon process variations, temperature changes, and the like. Compensation can be carried out using the information in Table 2 to generate successively sets of interpolated/extrapolated filter coefficients as described in connection with FIG. 7B to characterize and adjust the filter's behavior over a frequency band. In addition to frequency- or channel-specific estimation coefficients produced by the compensation, this can also involve locking (e.g., low, middle, and high) frequency or channel coefficients for the whole band to be able to follow temperature drifts etc. in an optimal way.

For example, this can easily be done directly to the frequency used as input through a compensation parameter, e.g., a kHz/Kelvin parameter, considering the interpolation variable x as the frequency. In this way, a temperature change that can cause a drift in the optimal PLL frequency response as depicted by FIG. 3C can be compensated by a kHz/K value stored in memory. Of course, the temperature compensation parameter can have other forms, such as MHz/C and Hz/F, provided the computations are handled correctly. To provide such temperature compensation, the filter coefficient computer 602 would receive one or more temperature measurements from a suitable sensor, which is typically included in a transmitter 100 for other purposes, e.g., temperature compensation of a reference crystal oscillator.

Figure 7B:
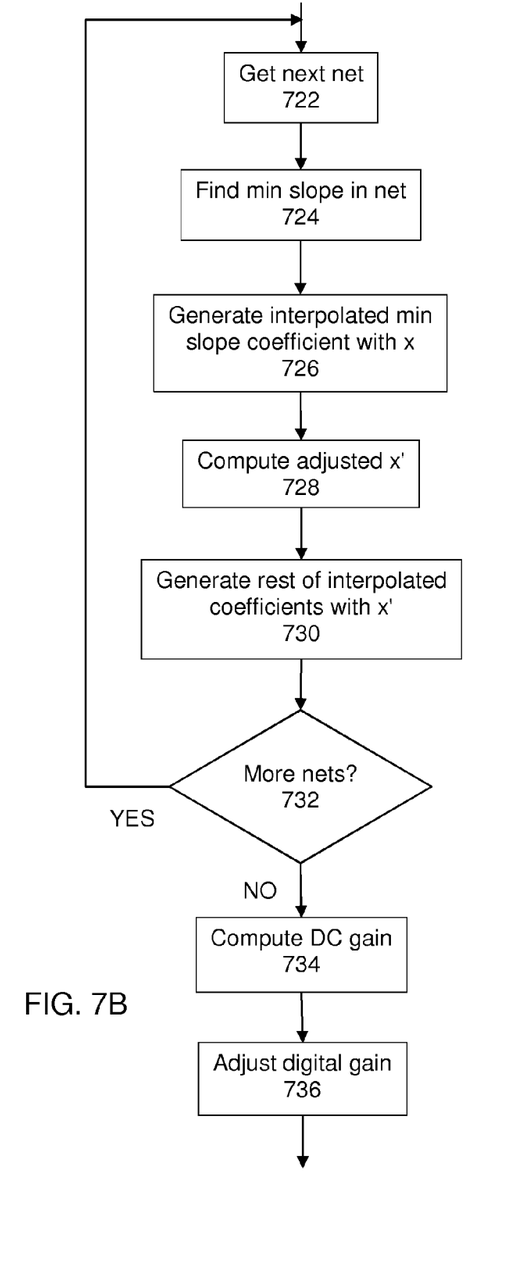

FIG. 7B is a flowchart of an example of a method of generating interpolated filter coefficients that can be carried out by the processor 600, and the following is a description of steps in the method. It will be understood that this is an example of a suitable method, and that many other examples can be implemented. The method uses the sets of estimation coefficients (e.g., the sets of C, m pairs in Table 2) for the filter coefficients in the net(s) of a filter, which is called netlist in the following description; an operating frequency f; and a base frequency fb (e.g., 880 MHz).

The method can begin by getting (step 722) a first or next net in the netlist. In the example depicted by FIG. 6 and Table 2, the first net can be 1A, which includes the coefficients A0 and A1 in filter section prim 1. The slope with the smallest absolute value in the gotten net is found (step 724). In this example for net 1A, the absolute values of the slope m of 1A0 and 1A1 are the same, and so the slope for 1A0 can be arbitrarily chosen. In general, the result of step 724 is the pair of coefficients in Table 1 having the smallest number of quantization steps between them, which translates into finding the slope in Table 2 with the lowest absolute value (as it does not matter if one goes up or down the quantization steps).

Figure 7C:
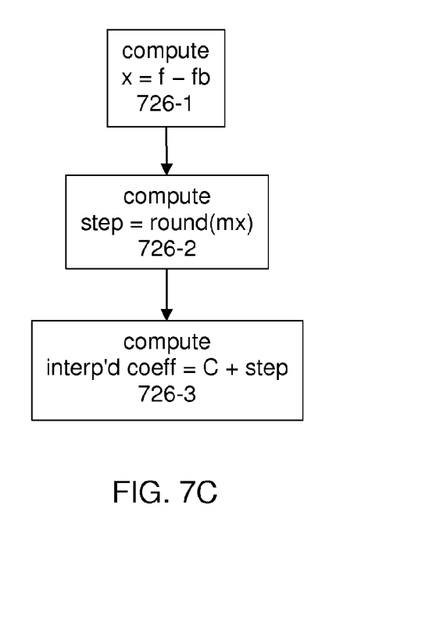

The method proceeds with generating (step 726) an interpolated value for the filter coefficient corresponding to the smallest slope (which is 1A0 in this example) in a manner as discussed above in connection with FIGS. 5A, 5B. For example as depicted in FIG. 7C, a linear interpolation using a table of C, m pairs of estimation coefficients, such as Table 2, can include computing a frequency difference x=f−fb (step 726-1), in which f represents a frequency of the desired interpolated filter coefficient, and fb is the value in Table 1 that represents the base frequency for the estimation coefficients. Thus, the frequency difference x can be seen as a desired interpolated point relative to the base frequency fb.

In this example, the interpolated filter coefficient f(x) for the smallest slope, using the nomenclature of FIG. 5A, will be seen as given by:

$$f(x) = C + mx$$

but rather than using the product mx directly, the product is rounded off to the nearest integer, not truncated, which is important to maintain the correct DC gains and other properties of a fixed-point-arithmetic filter. Thus, the value of a variable step given by:

$$\text{step} = \text{round}(mx)$$

can be conveniently computed (step 726-2), and then the interpolated filter coefficient is computed (step 726-3) according to:

$$\text{interpolated coefficient} = C + \text{step}$$

in which C is the corresponding estimation coefficient (see Table 2) with optimum performance at the base frequency fb as above.

For computing the rest of the set of interpolated filter coefficients, the method takes the rounding of the product mx into account by computing (step 728) an adjusted frequency difference x' according to:

$$x' = \text{step}/m = \text{round}(mx)/m$$

and uses the adjusted difference x' to generate (step 730) the rest of the interpolated filter coefficients in the gotten net as described above according to:

$$\text{interpolated coefficient} = C + \text{step}' = C + \text{round}(mx'),$$

in which C and m are the respective estimation coefficients for the rest of the filter coefficients.

Using the adjusted frequency difference x' means that although the frequency difference x can have any value, the adjusted frequency difference x' can take only those values where step takes an integer value (not a decimal value), and so x' follows the possible values on the smallest slope. The uses of x and x' are discussed in more detail below in connection with FIG. 8.

If there are still nets to interpolate (YES in step 732), as there are in this example (i.e., net 1B and the nets in prim 4), then the method flow returns to step 722, otherwise (NO in step 732), the method proceeds to step 734, in which the DC gain of the filter with the interpolated filter coefficients is computed, e.g., from the filter transfer function. The DC gain calculations can be carried out the by the DC gain computer 604 or another suitable electronic processor or logic circuit. As noted above, the DC gain can be readily computed from the transfer function, which is known, by setting all z in the transfer function to unity.

When the DC gain is determined, the method proceeds with adjusting, or scaling (step 736), the digital signal level accordingly, and the scaling is carried out by the digital scaler 606. For example, assume that an optimal deviation for a GMSK modulator has been found by setting the total gain of the pre-emphasis filter and the scaler to a value 5.57. In setting that total gain, it was known that the scaler gain was 1.73 and the filter gain, which can have been a filter with one of the initial sets of coefficients, was 3.28 (i.e., (1.73)(3.28)=5.57). Also assume that after carrying out an interpolation as depicted in FIG. 7B, the filter gain is computed to be 3.11. To maintain the total gain of 5.57 and thus the desired GMSK deviation, the scaler gain must be set to 1.79. Failure to do so causes extra phase error.

It will be noted that the base frequency or estimation coefficient C need not be the lowest frequency in a band. Of course, when characterizing the performance of real hardware, it is generally easier to measure and see the change in optimum if the two initial sets of coefficients are well apart from each other, and so it can be convenient for one set to be at the low end of a band and the other set to be at the high end of the band. Also, when the slopes are determined and the interpolated coefficients f(x)=C+mx are formed, the calculations can more easily avoid overflow and other numerical problems when C is chosen for a mid-band frequency because the calculations for the low side of the band will probably be a mirror of the calculations for the high side of the band.

In addition, the interpolation in practice generally has to produce usable results also on frequencies out of band, especially if compensation is applied. In extreme temperature and with a silicon process at the limit of what will produce functional chips, the compensation can be significant, i.e., more than the whole band. Therefore, it can be desirable to run through all possible interpolation results with an automatic test equipment and/or software to ensure that no overflow or other numerical problems arise in the filter or scaler even including out-of-band frequencies. For example, it can be necessary to test a filter for up to as much as an extra 100 MHz on either side of a 50-MHz-wide GSM band to ensure that a transmitter remains unusable in extreme cases.

Moreover, it should be understood that different compensations can be used in combination with interpolation. For example, compensation of silicon process variations and compensation of temperature variations can be used with interpolation to address problems with a PLL response that changes faster inside VCO sub-bands than it does between sub-bands. This can be called a phase-error sawtooth problem.

Furthermore, the interpolated coefficients can be re-scaled in order to "self-adjust" the filter's DC gain, removing any need for a separate scaler 606. Re-scaling the coefficients can be carried out by, for example, multiplying the IIR forward net(s) by a factor or factors that does not or do not change the frequency response of the filter, but change only the DC gain.

Example of Numerical Handling

Implementation of the coefficient generation method, such as that depicted by FIG. 7B, depends in general on the implementation of the pre-emphasis filter. Based on knowledge of the properties of the numerical values involved in a specific filter implementation, some steps of the method can be omitted or a particular pattern forced. For example, it may be known that the shortest numerical distance (lowest absolute slope value) is always found in a certain coefficient pair in Table 1. In such a case, the computational complexity of the methods can be reduced by using a predefined computation order (or equivalently a pre-sorted netlist), thereby omitting searching for the lowest slope, the next lowest slope, etc. (i.e., step 724) and saving some processor cycles.

Figure 8:
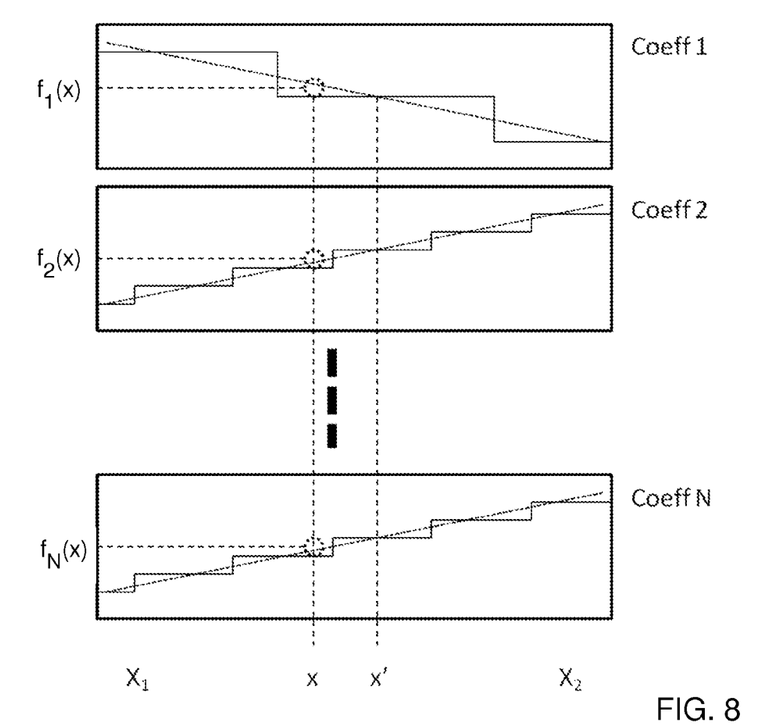
FIG. 8 illustrates quantization of interpolated filter coefficients.

A set of generic rules can be described that overcomes difficulties in selecting numerical values for the filter coefficients. If a pre-emphasis filter of the IIR type and interpolation between two pre-computed coefficient sets are assumed, straightforward linear interpolation and rounding of the result to the closest integer value may break design constraints on the filter (e.g., constraints on the DC gain and/or frequency response) as described above. The inventors have recognized that this is a kind of quantization problem, which is illustrated by FIG. 8 that shows for example interpolated Coeff 1 denoted $f_1(x)$ at a value x that is shifted due to quantization to a value x'. Similar shifts in the interpolated x values of other coefficients Coeff 2 and Coeff N are depicted in FIG. 8. It will be appreciated that FIGS. 5A and 5B illustrate general principles of interpolation in accordance with this invention, and FIG. 8 illustrates real-world problems that can arise from representing numbers digitally using a finite number of bits (i.e., quantization or rounding errors/problems). FIG. 8 shows linear interpolation with an addition that the algorithm will "snap to grid" so that only the subset of filter setups with the same properties (e.g., same DC gains) as a base set will be produced as output.

Figure 9A:
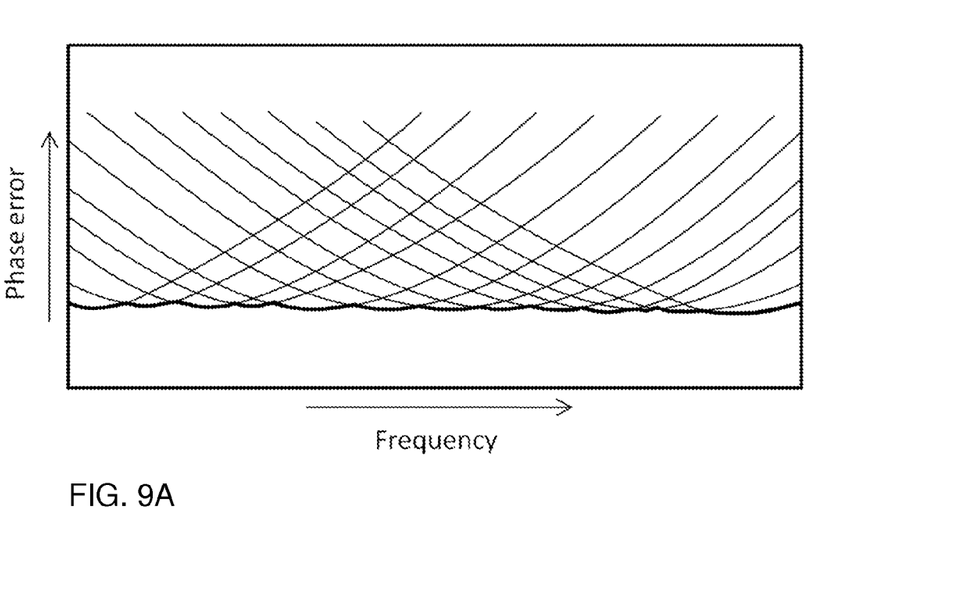
FIGS. 9A, 9B 9C, and 9D illustrate phase error performance across a frequency band and in several mobile telephones.

FIGS. 9A-9D illustrate phase error performance in mobile telephones and how that performance can be improved in telephones that use the methods and devices described above. FIG. 9A illustrates phase error behavior of a digital pre-emphasis filter and how interpolation in accordance with aspects of this invention can improve phase error performance across a frequency band. In FIG. 9A, the coefficients of the pre-emphasis filter are independently optimized, i.e., interpolated, for each of a number of frequency channels across the frequency band. The filter coefficients of the pre-emphasis filter would advantageously be changed as the frequency channel (i.e., the operating frequency of the transmitter using the filter) is changed.

Figure 9B:
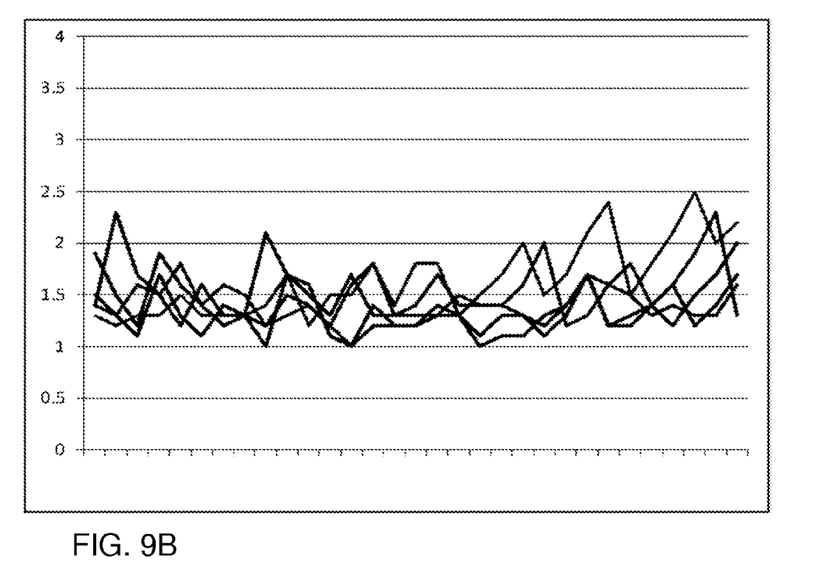

FIG. 9B shows phase error with respect to frequency of the transmitters in five GSM phones that each have an IIR pre-emphasis filter with one fixed set of coefficients, i.e., one set for the whole frequency band and without interpolation as described above. In FIG. 9B, the vertical axis shows phase error in degrees and the horizontal axis shows a frequency band having separate channels indicated by tick marks. FIG. 9B illustrates phase-error variation between transmitters, which can be due to silicon manufacturing process fluctuations and other effects, as well as the typically higher phase errors toward the band edges (with a maximum phase error of about 2.5 degrees).

Figure 9C:
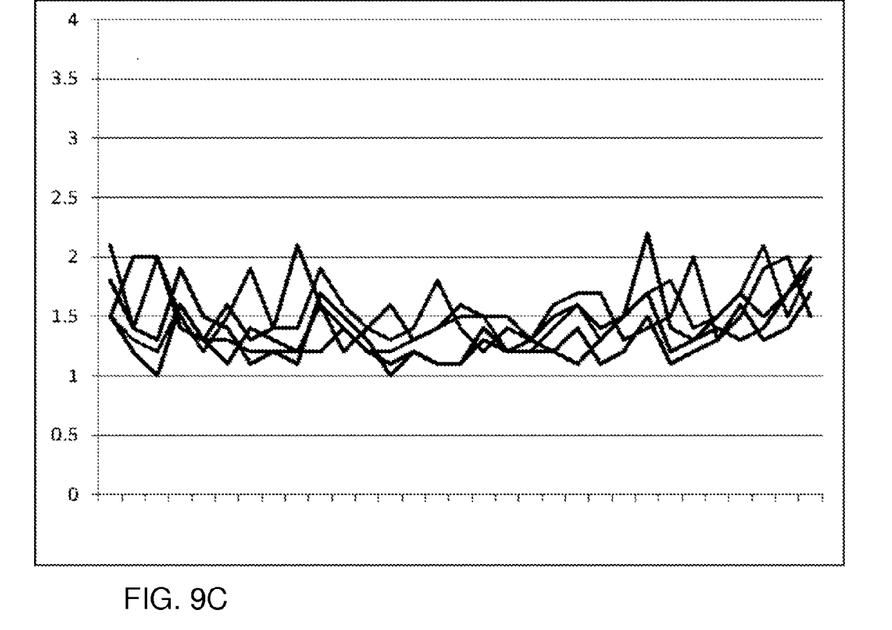

FIG. 9C shows phase error with respect to frequency of the transmitters in five GSM phones that each have an IIR pre-emphasis filter with one respective fixed set of coefficients, i.e., one set of coefficients for the whole frequency band but interpolated as described above for the particular transmitter. A signal processor circuit in each phone calculates a respective optimal set of filter coefficients based on predetermined knowledge of that phone's PLL phase error vs. frequency response across the whole frequency band. The coefficient calculations are done using the interpolation and compensation methods described above. It will be noted that FIG. 9C shows that the five transmitters had more equal phase error performances, with a maximum phase error of only about 2.3 degrees, and so were improved compared with FIG. 9B. In addition, FIG. 9C shows that "cups", or dips in the phase errors of the transmitters go together when applying automatic unit-to-unit compensation.

Figure 9D:
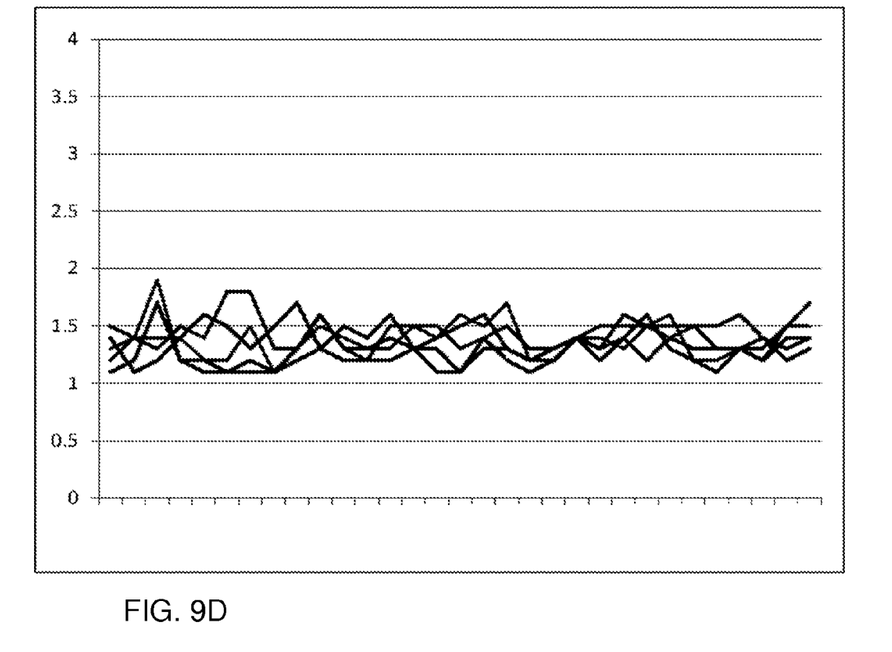

FIG. 9D shows phase error with respect to frequency of the transmitters in five GSM phones that each have an IIR pre-emphasis filter with respective multiple sets of coefficients, i.e., sets of coefficients for respective frequency channels in the frequency band and interpolated as described above for the particular transmitter. Thus, FIG. 9D can be considered as depicting a final stage in which interpolation is fully in use, such that a phone calculates an optimal set of filter coefficients for each of multiple transmit frequency channels in a band and with the compensations of FIG. 9C applied as well. It will be noted that FIG. 9D shows that the five transmitters had even more equal and flatter phase error performances, with a maximum phase error of only about 1.9 degrees, and so were improved compared with FIGS. 9B and 9C. It can also be noted that VCO sub-band compensation that is described above was not in use in generating FIG. 9D, but if it had been, then the last peaks would be more attenuated and the responses would look more or less like straight lines.

Although the above-described examples are implemented in software instructions executed by a programmable digital signal processor, it will be understood by the artisan that implementation in other hardware is also feasible. It will also be appreciated that this description focuses on IIR filters and devices using such filters, but that is done only for convenience. The artisan will understand that this invention can also be embodied in FIR filters and devices using such filters.

Embodiments of this invention have a number of advantages over prior techniques. For example, virtually step-less adjustment of filter response can be provided, thereby enabling optimal or near-optimal matching of PLL and pre-emphasis filter frequency responses that mitigates frequency mismatches due to manufacturing process, temperature, and other variations. In addition, saw-tooth-shaped behaviors due to VCOs can be mitigated by including in an interpolation model knowledge of the position within a sub-band and the respective phase error change due to the saw-tooth effect. Phase error behavior can be much flatter over a frequency band. Devices can be compensated for unit-to-unit variation, temperature variation, and/or any other known or predictable variation in frequency response, e.g., PLL frequency response. Filter coefficients can be computed at run time as the computational complexity is low. Thus, production tuning requirements of modulator components can be relaxed.

The methods and devices described above can be combined and re-arranged in a variety of equivalent ways, and the methods can be performed by one or more suitable electronic circuits (e.g., discrete logic gates interconnected to perform a specialized function, or application-specific integrated circuits). Devices embodying this invention can include, for example, wireless telephones, sensors, computers, and other devices that include signal modulators with pre-emphasis.

Thus, the invention may be embodied in many different forms, not all of which are described above, and all such forms are contemplated to be within the scope of the claims.

What is claimed is:

1. A method in a digital processor circuit of generating a set of interpolated coefficients of a digital filter configured with at least one net, wherein a net includes a group of filter coefficients of a respective feedback or feed-forward loop in the digital filter, the method comprising:

finding, by the digital processor circuit for a net, a smallest slope in sets of estimation coefficients for filter coefficients of the net, wherein a respective set of estimation coefficients for each filter coefficient includes a base coefficient value and a slope;

generating a respective interpolated filter coefficient of the smallest slope based on a frequency difference value according to an interpolation function and the slope;

computing an adjusted frequency difference value based on the frequency difference value; and generating remaining interpolated filter coefficients of the net based on the respective estimation coefficients and the adjusted frequency difference value according to the interpolation function.

2. The method of claim 1, wherein generating the respective interpolated filter coefficient of the smallest slope comprises determining the frequency difference value by forming a difference between an operating frequency and a base frequency of the set of estimation coefficients, rounding a product of the slope and the frequency difference value, and computing the interpolated filter coefficient by forming a sum of the base coefficient value and the rounded product; and computing the adjusted frequency difference value includes dividing a rounded product of the slope and the frequency difference value by the slope.

3. The method of claim 1, further comprising determining a DC gain based on the set of interpolated coefficients.

4. The method of claim 1, further comprising compensating the sets of estimation coefficients for at least one of filter fabrication process variations and temperature variations.

5. An electronic signal modulator, comprising:

a pulse-shaping filter configured for receiving a digital modulation data signal;

a phase-locked loop (PLL) configured for generating a carrier signal modulated by the digital modulation data signal, wherein the PLL has a low-pass frequency response; and a digital pre-emphasis filter having a frequency response configured for compensating the frequency response of the PLL, wherein the digital pre-emphasis filter is configured with at least one net, each net including a group of filter coefficients of a respective feedback or feed-forward loop, and the frequency response of the pre-emphasis filter is determined by a set of interpolated filter coefficients generated according to the method of claim 1.

6. The modulator of claim 5, wherein the electronic signal modulator is included in a transmitter in a communication device.

7. The modulator of claim 6, wherein the communication device includes a power amplifier configured to receive the carrier signal modulated by the modulation data signal, and an antenna (160) configured to transmit a signal generated by the power amplifier.

8. A digital filter configured with at least one net, each net including a group of filter coefficients of a respective feedback or feed-forward loop in the digital filter, the filter comprising:
- a digital processor circuit configured to generate a set of interpolated coefficients of the digital filter by at least:
- finding, for a net, a smallest slope in sets of estimation coefficients for filter coefficients of the net, wherein a respective set of estimation coefficients for each filter coefficient includes a base coefficient value and a slope;
- generating a respective interpolated filter coefficient of the smallest slope based on a frequency difference value according to an interpolation function and the slope;
- computing an adjusted frequency difference value based on the frequency difference value; and
- generating remaining interpolated filter coefficients of the net based on the respective estimation coefficients and the adjusted frequency difference value according to the interpolation function.

9. The digital filter of claim 8, wherein generating the respective interpolated filter coefficient of the smallest slope comprises determining the frequency difference value by forming a difference between an operating frequency and a base frequency of the set of estimation coefficients, rounding a product of the slope and the frequency difference value, and computing the interpolated filter coefficient by forming a sum of the base coefficient value and the rounded product; and computing the adjusted frequency difference value includes dividing a rounded product of the slope and the frequency difference value by the slope.

10. The digital filter of claim 8, wherein the digital processor circuit generates the set of interpolated coefficients by also determining a DC gain based on the set of interpolated coefficients.

11. The digital filter of claim 8, wherein the digital processor circuit is further configured to compensate the sets of estimation coefficients for at least one of filter fabrication process variations and temperature variations.

\* \* \* \* \*